United States Patent
Yoon et al.

(10) Patent No.: US 9,245,932 B2
(45) Date of Patent: Jan. 26, 2016

(54) ORGANIC LIGHT EMITTING DISPLAY PANEL AND ORGANIC LIGHT EMITTING DISPLAY DEVICE INCLUDING THE SAME

(71) Applicant: LG DISPLAY CO., LTD., Seoul (KR)

(72) Inventors: Sung Wook Yoon, Goyang-si (KR); Sang Soo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/526,077

(22) Filed: Oct. 28, 2014

(65) Prior Publication Data

US 2015/0144908 A1 May 28, 2015

(30) Foreign Application Priority Data

Nov. 26, 2013 (KR) .................. 10-2013-0144540

(51) Int. Cl.
*H01L 33/00* (2010.01)
*H01L 27/32* (2006.01)

(52) U.S. Cl.
CPC ........ *H01L 27/3246* (2013.01); *H01L 27/3211* (2013.01); *H01L 27/3216* (2013.01); *H01L 27/3218* (2013.01); *H01L 27/3248* (2013.01); *H01L 27/3276* (2013.01)

(58) Field of Classification Search
CPC .................... H01L 2251/50; H01L 2251/53
See application file for complete search history.

(56) References Cited

U.S. PATENT DOCUMENTS

| | | | |
|---|---|---|---|
| 9,013,098 B1 * | 4/2015 | Kim et al. | 313/504 |
| 2012/0056531 A1 * | 3/2012 | Park et al. | 313/506 |
| 2013/0222217 A1 | 8/2013 | Shin et al. | |

FOREIGN PATENT DOCUMENTS

JP          2010-186582 A          8/2010

* cited by examiner

*Primary Examiner* — Reema Patel
(74) *Attorney, Agent, or Firm* — Birch, Stewart, Kolasch & Birch, LLP (57) ABSTRACT

Discussed is an organic light emitting display panel and an organic light emitting display device including the same. In the organic light emitting display panel, each of a plurality of unit pixels includes first to third driving transistors respectively connected to the first to third organic light emitting diodes, a first contact hole connected to one electrode of the first organic light emitting diode, a second contact hole connected to one electrode of the second organic light emitting diode, and a third contact hole connected to one electrode of the third organic light emitting diode, and are arranged in a matrix.

10 Claims, 6 Drawing Sheets

FIG. 1

Related Art

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATIONS

This application claims the priority benefit of the Korean Patent Application No. 10-2013-0144540 filed on Nov. 26, 2013, which is hereby incorporated by reference as if fully set forth herein.

BACKGROUND

1. Field of the Invention

The present invention relates to an organic light emitting display panel, and more particularly, to an organic light emitting display panel in which an arrangement structure of sub-pixels is changed to widen a width of an organic emission layer.

2. Discussion of the Related Art

A flat panel display (FPD) device is applied to various electronic devices such as portable phones, tablet personal computers (PCs), notebook computers, monitors, etc. Examples of the FPD device include liquid crystal display (LCD) devices, plasma display panel (PDP) devices, organic light emitting display devices, etc. Recently, electrophoretic display (EPD) devices are being widely used as one type of the FPD device.

Among the display devices, the organic light emitting display devices use a self-emitting element, and thus have a fast response time, high emission efficiency, high luminance, and a broad viewing angle.

The organic light emitting display devices may be configured in a top emission type where an organic light emitting diode (OLED) is formed on a lower substrate, and light emitted from the OLED is output to the outside through an upper substrate.

Moreover, the organic light emitting display devices may be configured in a bottom emission type where the OLED is formed on the lower substrate, and the light emitted from the OLED is transferred to the lower substrate.

Recently, organic light emitting display devices that emits light in a dual emission type where the bottom emission type is combined with the top emission type are being developed.

Figure 1:
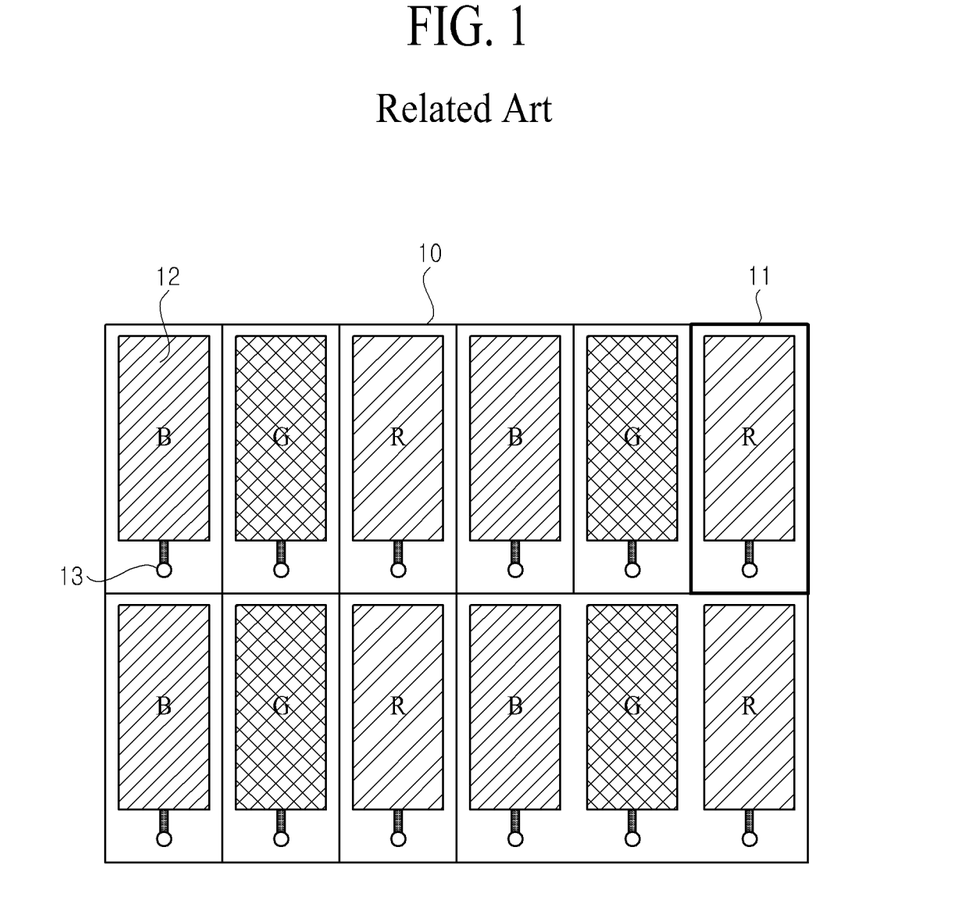
FIG. 1 is an exemplary diagram illustrating a related art organic light emitting display panel.

FIG. 1 is a first exemplary diagram illustrating a related art organic light emitting display panel 10, and particularly, is an exemplary diagram illustrating an organic light emitting display device in which a plurality of sub-pixels are arranged in a stripe structure.

A plurality of sub-pixels 11 applied to the related art organic light emitting display panel 10, as illustrated in FIG. 1, are arranged in the stripe structure.

A plurality of contact holes (PLN Hole) 13 illustrated in FIG. 1 may be formed in the organic light emitting display panel 10 so that a driving transistor, e.g. a driving thin film transistor (TFT) used to drive an OLED 12 is electrically connected to the OLED 12.

For example, the driving TFT (not shown) is insulated from the OLED 12 by an insulation layer (not shown). Therefore, the contact hole 13 may be formed on the insulation layer so that the driving TFT and the OLED 12 separated from each other by the insulation layer are electrically connected.

In this case, as illustrated in FIG. 1, the contact holes 13 are respectively formed at the same positions of lower ends of all the sub-pixels 11.

In the related art organic light emitting display panel 10, since the contact holes are respectively formed at the same positions of the lower ends of the sub-pixels 11, enhancement of an aperture ratio is limited when the sub-pixels 11 are formed by using a fine metal mask (FMM). That is, since each of the contact holes 13 is disposed adjacent to a boundary between adjacent sub-pixels, an emission area of each sub-pixel is reduced. Also, the fine metal mask has a pattern so as to correspond to one sub-pixel, and it is required to manufacture a smaller pattern when manufacturing a high-resolution organic light emitting display panel. However, there is a limitation in manufacturing a smaller pattern. The fine metal mask is a mask that is used to deposit an organic emission layer in units of a pixel in an organic light emitting display panel, and has a fine pattern. Therefore, the pattern of the fine metal mask should be further reduced in the high-resolution organic light emitting display panel, and for this reason, it is difficult to form a structure of the sub-pixels illustrated in FIG. 1. For example, in an organic light emitting display panel having a high resolution of 300 ppi or more, it is difficult to form the structure of the sub-pixels illustrated in FIG. 1.

That is, a resolution of organic light emitting display panels becomes increasingly higher, but due to the above-described structure of the sub-pixels of the related art, it is difficult to manufacture the high-resolution organic light emitting display panel.

To provide an additional description, as a resolution of an organic light emitting display panel increases, a size of a sub-pixel is reduced. In this case, a thickness of the fine metal mask used to manufacture the organic light emitting display panel is limited, and since a distance between ribs of the fine metal mask is insufficient, a desired aperture ratio cannot be realized in the organic light emitting display panel using a structure of sub-pixels of the related art. That is, in a process of evaporating an organic emission layer by using an evaporation process, due to a limitation of a method of manufacturing the fine metal mask, it is difficult to manufacture an organic light emitting display panel having a high resolution.

SUMMARY

Accordingly, the present invention is directed to provide an organic light emitting display panel and an organic light emitting display device including the same that substantially obviate one or more problems due to limitations and disadvantages of the related art.

An aspect of the present invention is directed to provide a high-resolution organic light emitting display panel and an organic light emitting display device including the same, in which an area of an organic emission layer is maximally widened in a unit pixel, thereby overcoming a limitation of a fine metal mask process in manufacturing a high-resolution organic light emitting display device.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display panel including a plurality of unit pixels which each include first to third organic light emitting diodes having different colors, wherein the plurality of unit pixels each include first to third driving thin film transistors (TFTs) respectively connected to the first to third organic light emitting diodes, a first contact hole connected to one electrode of the first organic light emitting diode, a second contact hole connected to one electrode of the second organic light emitting diode, and a third contact hole connected to one electrode of the third organic light emitting diode, and are arranged in a matrix type. Here, a plurality of the first organic light emitting diodes are arranged in a stripe type in unit pixels which are adjacent to each other in a first direction, a plurality of the third organic light emitting diodes are arranged adjacent to each other at a boundary of respectively adjacent two unit pixels, wherein the two adjacent unit pixels form a unit pixel pair, a plurality of second sub-pixels, wherein the second organic light emitting diode is adjacent to the third organic light emitting diode in the unit pixel, and is arranged farther apart from the boundary of the two adjacent unit pixels of the unit pixel pair than the third organic light emitting diodes of the unit pixel pair, the second and third contact holes are disposed between the second and third organic light emitting diodes of a respective unit pixel, and the first to third contact holes are arranged in parallel in a second direction of a respective unit pixel, wherein the second direction is perpendicular to the first direction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 2:
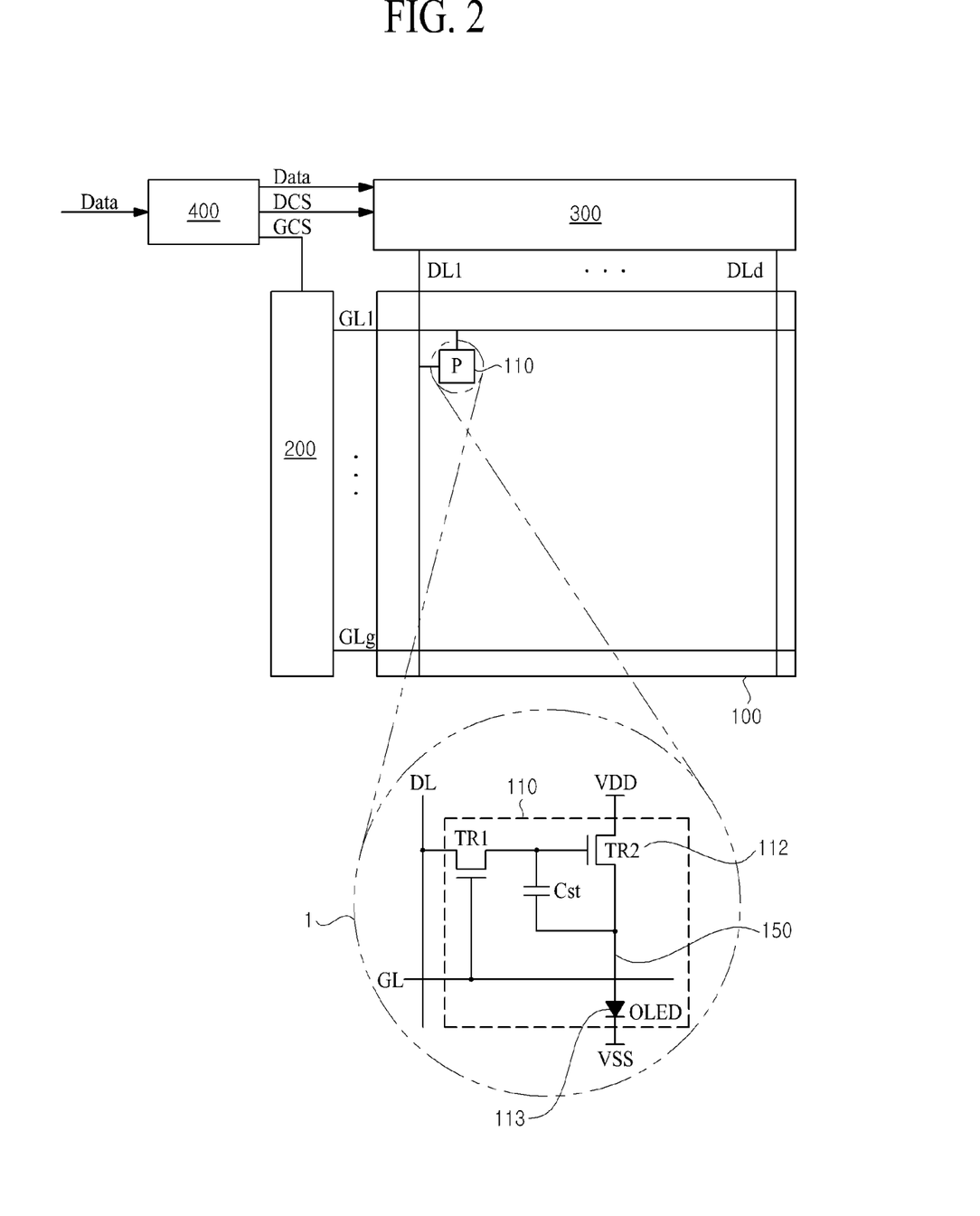
FIG. 2 is a block diagram of an organic light emitting display device according to an embodiment of the present invention.

FIG. 2 is a block diagram of an organic light emitting display device according to an embodiment of the present invention.

Embodiments of the present invention relate to a pixel arrangement structure of an organic light emitting display panel. Generally, since there is a limitation in manufacturing a fine metal mask, there is a limitation in manufacturing a high-resolution organic light emitting display panel by using an evaporation process. To solve such a limitation, the present invention provides an organic light emitting display panel, in which an arrangement structure of sub-pixels is changed to realize a high resolution, and an organic light emitting display device including the same.

In an organic light emitting display panel having a related art pixel structure, in order to electrically connect a driving thin film transistor (TFT) and an organic light emitting diode (OLED) which are separated from each other by an insulation layer, a contact hole formed in the insulation layer is formed adjacent to a boundary between vertically adjacent unit pixels. Therefore, when an organic emission layer is deposited by using a fine metal mask, there is a risk in which the organic emission layer is deposited in the contact hole, and for this reason, a plurality of the organic emission layers cannot be deposited at one time. However, according to an embodiment of the present invention, the plurality of organic emission layers may be deposited at one time.

An organic light emitting display device according to an embodiment of the present invention, as illustrated in FIG. 2, includes an organic light emitting display panel 100 including a plurality of sub-pixels 110 and a driver that drives the organic light emitting display panel 100. All the components of the device are operatively coupled and configured. Here, in the organic light emitting display panel 100, a sub-pixel P is formed in each of intersection areas between a plurality of gate lines GL1 to GLg and a plurality of data lines DL1 to DLd. Also, the driver includes a gate driver 200 that sequentially supplies a gate pulse to the gate lines GL1 to GLg formed in the organic light emitting display panel 100, a data driver 300 that respectively supplies data voltages to the data lines DL1 to DLd formed in the organic light emitting display panel 100, and a timing controller 400 that controls functions of the gate driver 200 and the data driver 300.

First, in the organic light emitting display panel 100, a sub-pixel (P) 110 is formed in each of the intersection areas between the plurality of gate lines GL and the plurality of data lines DL. The sub-pixel 110 is for expressing red, green or blue, and a blue sub-pixel, a red sub-pixel, and a green sub-pixel configure one unit pixel. That is, the one unit pixel includes the blue sub-pixel, the red sub-pixel, and the green sub-pixel.

The sub-pixel 110, as illustrated in an enlarged circle 1 of FIG. 2, may include an organic light emitting diode OLED, at least two or more transistors TR1 and TR2 which are connected to a data line DL and a gate line GL to control the organic light emitting diode OLED, and a storage capacitor Cst. Hereinafter, a first transistor TR1 is referred to as a switching TFT, and a second transistor 112 is referred to as a driving TFT.

First, the organic light emitting diode 113 includes a first electrode, an organic emission layer formed on the first electrode, and a second electrode formed on the organic emission layer. Here, the first and second electrodes may respectively be an anode electrode and a cathode electrode, or may respectively be a cathode electrode and an anode electrode. Hereinafter, a case in which the first electrode is the anode electrode and the second electrode is the cathode electrode will be described as an example of the present invention.

The anode electrode of the organic light emitting diode OLED is connected to a first power source VDD, and the cathode electrode is connected to a second power source VSS. The organic light emitting diode OLED emits light having certain luminance in correspondence with a current supplied from the second transistor 112.

Second, when the gate pulse is supplied to the gate line GL, various circuits included in the sub-pixel 110 control an amount of current supplied to the organic light emitting diode OLED in order for a current, corresponding to an image signal supplied to the data line DL, to be supplied to the organic light emitting diode OLED.

To this end, the sub-pixel 110 includes: the driving TFT 112 connected between the first power source VDD and the organic light emitting diode 113; the switching TFT TR1 connected to the driving TFT 112, the data line DL, and the gate line GL; and a storage capacitor Cst connected between a gate electrode of the driving TFT 112 and the organic light emitting diode 113. In FIG. 2, a sub-pixel according to an embodiment of the present invention is schematically illustrated, and particularly, the sub-pixel 100 including two transistors and one capacitor is illustrated. However, the sub-pixel 100 may be configured in various types with various compensation transistors.

Moreover, as illustrated in FIG. 2, the anode electrode or cathode electrode of the organic light emitting diode 113 is connected to the driving TFT 112 through a connection electrode 150.

A detailed configuration of the organic light emitting display panel 100 will be described in detail with reference to FIGS. 3 to 6.

The timing controller 400 outputs a gate control signal GCS for controlling the data driver 200 and a data control signal DCS for controlling the data driver 300 by using a vertical sync signal, a horizontal sync signal, and a clock signal which are supplied from an external system (not shown).

Moreover, the timing controller 400 samples input video data input from the external system, realigns the sampled video data, and supplies the realigned digital image data RGB to the data driver 300.

That is, the timing controller 400 realigns the input video data supplied from the external system, and transfers the realigned digital image data to the data driver 300. The timing controller 400 generates the gate control signal GCS for controlling the data driver 200 and the data control signal DCS for controlling the data driver 300 by using the clock signal, the vertical sync signal, the horizontal sync signal, and a data enable signal which are supplied from an external system (not shown), and respectively transfers the gate control signal GCS and the data control signal DCS to the gate driver 200 and the data driver 300. Here, the clock signal, the vertical sync signal, and the horizontal sync signal are referred to as a timing signal.

To this end, the timing controller 400 includes: a receiver that receives the various signals such as the input video data supplied from the external system; an image data processor that realigns the input video data among the signals received by the receiver so as to match a structure of the panel 110, and generates the realigned digital image data; a control signal generator that generates the gate control signal GCS and the data control signal DCS for respectively controlling the gate driver 200 and the data driver 300 by using the signals received from the receiver; and a transferor that outputs the gate control signal GCS to the gate driver 200 and outputs the data control signal DCS and the image data, generated by the image data processor, to the data driver 300.

The data driver 300 converts the image data, input from the timing controller 400, into analog data voltages and respectively supplies the data voltages for one horizontal line to the data lines at every one horizontal period in which the scan pulse is supplied to a corresponding gate line. That is, the data driver 300 converts the image data into the data voltages by using gamma voltages supplied from a gamma voltage generator (not shown), and respectively outputs the data voltages to the data lines.

The data driver 300 shifts a source start pulse (SSP) input from the timing controller 400 according to a source shift clock (SSC) to generate a sampling signal. The data driver 300 latches pixel data RGB (image data) according to the sampling signal to convert the image data into data voltages, and respectively supplies the data voltages to the data lines in units of a horizontal line in response to a source output enable signal (SOE).

To this end, the data driver 300 may include a shift register, a latch, a digital-to-analog converter (DAC), and an output buffer.

The shift register outputs the sampling signal by using control signals received from the timing controller 400.

The latch latches the digital image data Data that are sequentially received from the timing controller 400, and simultaneously outputs the digital image data to the DAC.

The DAC simultaneously converts the image data Data, transferred from the latch, into positive or negative data voltages, and outputs the positive or negative data voltages. That is, the DAC converts the image data into the positive or negative data voltages according to a polarity control signal transferred from the timing controller 400, by using the gamma voltages supplied from the gamma voltage generator (not shown), and respectively outputs the positive or negative data voltages to the data lines.

The output buffer outputs the data voltages, transferred from the DAC, to the data lines DL1 of the organic light emitting display panel 100 according to the source output enable signal (SOE) transferred from the timing controller 400.

The gate driver 200 sequentially supplies a gate pulse to the gate lines GL1 to GLg of the organic light emitting panel 100 in response to the gate control signal GCS input from the timing controller 400. Therefore, the switching TFTs of respective sub-pixels 110 on a corresponding horizontal line receiving the gate pulse are turned on, and an image is output to the sub-pixels 110.

That is, the gate driver 200 shifts a gate start pulse (GSP) transferred from the timing controller 400 according to a gate shift clock (GSC), and sequentially supplies the gate pulse having a gate-on voltage (Von) to the gate lines GL1 to GLg. During the other period in which the gate pulse having the gate-on voltage (Von) is not supplied, the gate driver 200 supplies a gate-off voltage (Voff) to the gate lines GL1 to GLg.

The gate driver 200 may be provided independently from the organic light emitting display panel 100, and may be implemented in a type which is electrically connectable to the organic light emitting display panel 100 in various methods. However, the gate driver 200 may be implemented in a gate-in panel (GIP) type which is equipped in the organic light emitting display panel 100. In this case, the gate control signals for controlling the gate driver 200 may include a start signal (VST) and a gate clock (GCLK).

Moreover, in the above description, the data driver 300, the gate driver 200, and the timing controller 400 are illustrated as being separately provided, but at least one selected from the data driver 300 and the gate driver 200 may be provided as one body with the timing controller 400.

Figure 3:
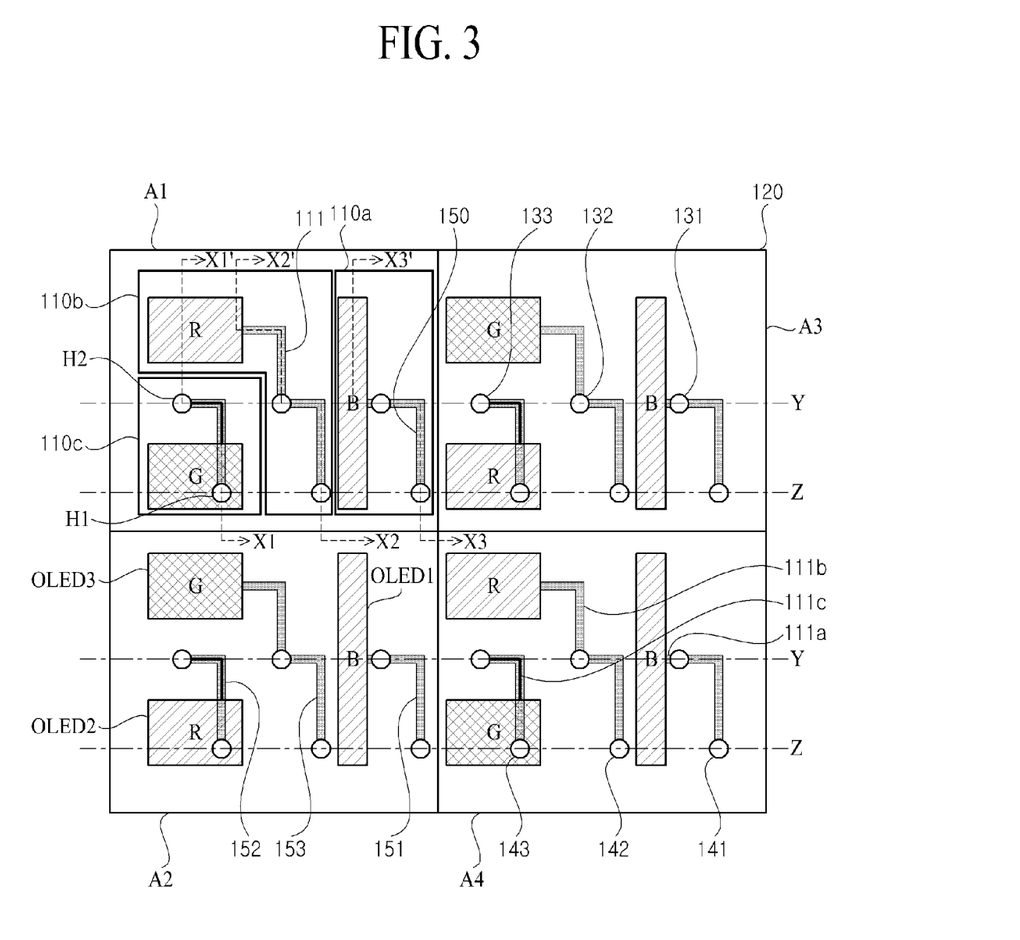
FIG. 3 is an exemplary diagram illustrating a plane structure of an organic light emitting display panel according to an embodiment of the present invention.

FIG. 3 is an exemplary diagram illustrating a plane structure of an organic light emitting display panel according to an embodiment of the present invention, and particularly, illustrates structures of a plurality of sub-pixels 110a to 110c configuring the organic light emitting display panel.

The organic light emitting display panel according to an embodiment of the present invention, as illustrated in FIG. 3, includes a plurality of unit pixels 120. Each of the unit pixels 120 includes a blue sub-pixel B for expressing blue, a red sub-pixel R for expressing red, and a green sub-pixel G for expressing green. Here, the horizontal line is formed in a second direction of the organic light emitting display panel, for example, in a direction parallel to the gate line of FIG. 2, and a plurality of unit pixels are formed in one row along the horizontal line. The second direction is referred to as a lateral direction.

Each of the unit pixels 120 includes three sub-pixels 110a to 110c, which may be the blue sub-pixel 110a, the red sub-pixel 110b, and the green sub-pixel 110c.

White and black may be expressed by a combination of the sub-pixels.

Hereinafter, for convenience of description, the organic light emitting display panel according to the embodiments of the present invention will be described on the assumption that the blue sub-pixel is the blue sub-pixel 110a, the red sub-pixel is the red sub-pixel 110b, and the green sub-pixel is the green sub-pixel 110c.

The first sub-pixel 110a includes a first organic light emitting diode OLED1 that expresses blue B, the second sub-pixel 110b includes a second organic light emitting diode OLED2 that expresses red, and the third sub-pixel 110c includes a third organic light emitting diode OLED3 that expresses green. That is, the first organic light emitting diode OLED1 includes a blue organic emission layer, the second organic light emitting diode OLED2 includes a red organic emission layer, and the third organic light emitting diode OLED3 includes a green organic emission layer.

Each of the first to third organic light emitting diodes OLED1 to OLED3 may be configured with a white light emitting diode. In this case, it may be understood that the first to third sub-pixels include a blue color filter, a red color filter, and a green color filter, respectively. However, in the following description, each of the first to third organic light emitting diodes is a light emitting diode that outputs unique color light.

First, each of the sub-pixels 110 configuring the unit pixel 120 includes a driving TFT 112, an organic light emitting diode (OLED) 190 connected to the driving TFT 112, an insulating layer which is formed on the driving TFT 112 and includes an insulating layer hole H1, a planarizing layer which is formed on the insulating layer and includes a planarizing layer hole H2, and a connection electrode 150 which is formed between first and second insulating layers configuring the insulating layer and connects a first electrode of the driving TFT 112 to a first electrode of the organic light emitting diode 190 through the insulating layer hole H1 and the planarizing layer hole H2. That is, the connection electrode 150 may electrically connect the first electrode of the driving TFT 112 to the first electrode of the organic light emitting diode 190. Here, the first electrode and a second electrode of the driving TFT 112 may respectively be a source electrode and a drain electrode, or may respectively be the drain electrode and the source electrode, depending on a type of the driving TFT 112. Hereinafter, for convenience of description, a case in which the first electrode is the source electrode and the second electrode is the drain electrode will be described as an example of the present invention. Also, as described above, a case in which the first electrode of the organic light emitting diode is an anode electrode and a second electrode of the organic light emitting diode is a cathode electrode will be described below as an example of the present invention.

Here, the insulating layer hole H1 is electrically connected to the source electrode of the driving TFT 112. In particular, the insulating layer hole H1 is formed not to overlap at least one of other metal lines, for example, a gate line, a data line, a driving power line, a sensing signal line, and a reference voltage line, so that interference does not occur.

Moreover, the connection electrode 150 is formed between the insulating layer with the insulating layer hole H1 formed therein and the planarizing layer with the planarizing layer hole H2 formed therein, and connects the anode electrode to the source electrode through the insulating layer hole H1 and the planarizing layer hole H2.

Therefore, the insulating layer hole H1 connected to the source electrode does not overlap the lines ML, and the planarizing layer hole H2 connected to the anode electrode does not overlap the organic emission layer. Therefore, the organic emission layer included in each of the sub-pixels 110 may be efficiently and freely disposed, and thus, an aperture ratio is enhanced, thereby improving a quality of an image.

Second, in each of the unit pixels 120, the first organic light emitting diode OELD1 is formed along a first direction (a vertical direction) vertical to the horizontal line, and the second and third organic light emitting diodes OELD2 and OLED3 are disposed along the first direction in parallel with the first organic light emitting diode OELD1.

For example, the first organic light emitting diode OELD1 may be arranged in a stripe type in unit pixels which are adjacent to each other in the vertical direction, and a plurality of the third organic light emitting diodes OELD3 may be arranged adjacent to each other at a boundary of adjacent unit pixels. The second organic light emitting diode OELD2 may be adjacent to the third organic light emitting diode OELD3 in a unit pixel, and may be arranged farther apart from the boundary than the third organic light emitting diode OELD3.

Third, in each of the unit pixels 120, the insulating layer hole H1 for electrically connecting the connection electrode 150 to the driving TFT 112 which drives the organic light emitting diode formed in one of the sub-pixels 110 is formed at an insulating layer hole part Z which is formed at a lower end of the unit pixel 120. Here, the lower end of the unit pixel 120 denotes a lower end of unit pixel 120 in a plan view illustrated in FIG. 3.

For example, a first insulating layer hole 141 which electrically connects a first connection electrode 151 and a first driving TFT driving the first organic light emitting diode OELD1, a second insulating layer hole 143 which electrically connects a second connection electrode 152 and a second driving TFT driving the second organic light emitting diode OELD2, and a third insulating layer hole 142 which electrically connects a third connection electrode 153 and a third driving TFT driving the third organic light emitting diode OELD3 are formed in one row along the insulating layer hole part Z. Here, the insulating layer hole part Z is formed along the second direction (the lateral direction) parallel to the horizontal line, in which case the insulating layer hole part Z may overlap a portion of each of the sub-pixels.

Fourth, in each of the unit pixels 120, a planarizing layer hole H2 for electrically connecting the organic light emitting diode to the connection electrode 150 formed in one of the sub-pixels 110 is formed at a planarizing layer hole part Y which is formed between the second and third organic light emitting diodes OLED2 and OLED3 and at a central portion of the first organic light emitting diode OLED1.

For example, a first planarizing layer hole 131 which electrically connects the first connection electrode 151 and the first driving TFT driving the first organic light emitting diode OELD1, a second planarizing layer hole 133 which electrically connects the second connection electrode 152 and the second driving TFT driving the second organic light emitting diode OELD2, and a third planarizing layer hole 132 which electrically connects the third connection electrode 153 and the third driving TFT driving the third organic light emitting diode OELD3 are formed in one row along the planarizing layer hole part Y.

Here, the second and third planarizing layer holes are disposed between the second and third organic light emitting diodes, and the first to third planarizing layer holes are disposed in parallel in the lateral direction. The planarizing layer hole part Y is formed along the second direction parallel to the horizontal line. In particular, the planarizing layer hole part Y is formed at a central line that vertically divides the unit pixels 120 along the horizontal line.

To provide an additional description, in each of the unit pixels, the connection electrodes 151 to 153 are connected to the driving TFTs 112 formed in the sub-pixels 110 through the insulating layer holes 141 to 143, the connection electrodes 151 to 153 are connected to the organic light emitting diodes through the planarizing layer holes 131 to 133, the planarizing layer hole part Y is formed in parallel with the horizontal line along a space between the second and third organic light emitting diodes OLED2 and OLED3, and the planarizing layer holes 131 to 132 are formed at the planarizing layer hole part Y.

Moreover, the insulating layer holes 141 to 143 are formed along the insulating layer hole part Z, formed in parallel with the planarizing layer hole part Y, at lower ends of the unit pixels.

Moreover, the planarizing layer holes 131 to 133 are formed to overlap a bank which divides the sub-pixels, and the insulating layer holes 141 to 143 are formed to overlap the bank or the sub-pixel. For example, in FIG. 3, each of areas referred to by R, G and B is an area in which an organic emission layer of the organic light emitting diode is formed, and corresponds to a display part outputting light, and other areas are areas in which the bank is formed. In this case, the planarizing layer holes 131 to 133 may be covered by the bank. Also, the planarizing layer holes 131 to 133 are respectively formed in areas which do not overlap the organic emission layers of the organic light emitting diodes. For example, as illustrated in FIG. 3, since the planarizing layer holes 131 to 133 are respectively formed in areas where the bank is formed, the planarizing layer holes 131 to 133 do not overlap the respective organic emission layers. However, a portion of each of the planarizing layer holes 131 to 133 may be formed to overlap a corresponding organic emission layer. The planarizing layer holes 131 to 133 are filled by the bank.

Fifth, the second organic light emitting diodes OLED2 respectively formed in the unit pixels 120 which are adjacent to each other in the first direction (the vertical direction) vertical to the horizontal line are adjacent to each other, and the third organic light emitting diodes OLED3 respectively formed in the unit pixels 120 which are adjacent to each other in the first direction are adjacent to each other.

For example, in a first unit pixel A1 (which is formed at a left upper end) of four unit pixels 120 illustrated in FIG. 3, the second and third organic light emitting diodes OLED2 and OLED3 are disposed in a vertical direction along the first direction, and particularly, the third organic light emitting diode OLED3 is disposed at a lower side. Also, in a second unit pixel A2 (which is formed at a left lower end) of the four unit pixels 120 illustrated in FIG. 3, the second and third organic light emitting diodes OLED2 and OLED3 are disposed in a vertical direction along the first direction, and particularly, the third organic light emitting diode OLED3 is disposed at an upper side.

Therefore, the third organic light emitting diodes OLED3 respectively formed in the first and second unit pixels A1 and A2 which are adjacent to each other in the first direction are adjacent to each other.

Moreover, in a third unit pixel A3 (which is formed at a right upper end) of the four unit pixels 120 illustrated in FIG. 3, the second and third organic light emitting diodes OLED2 and OLED3 are disposed in a vertical direction along the first direction, and particularly, the second organic light emitting diode OLED2 is disposed at a lower side. Also, in a fourth unit pixel A4 (which is formed at a right lower end) of the four unit pixels 120 illustrated in FIG. 3, the second and third organic light emitting diodes OLED2 and OLED3 are disposed in a vertical direction along the first direction, and particularly, the second organic light emitting diode OLED2 is disposed at an upper side.

Therefore, the second organic light emitting diodes OLED2 respectively formed in the third and fourth unit pixels A3 and A4 which are adjacent to each other in the first direction are adjacent to each other.

In addition, since the unit pixels 120 formed in the organic light emitting display panel 100 are formed in a pattern illustrated in FIG. 3, the second organic light emitting diodes OLED2 respectively formed in the unit pixels 120 which are adjacent to each other in the first direction are adjacent to each other, and the third organic light emitting diodes OLED3 respectively formed in the unit pixels 120 which are adjacent to each other in the first direction are adjacent to each other.

However, in the organic light emitting display panel according to an embodiment of the present invention, organic light emitting diodes of the same color respectively formed in the unit pixels 120 which are adjacent to each other in the first direction may be disposed so as not to be adjacent to each other.

Sixth, in each of unit pixels which are adjacent to each other in the first direction, the second and third organic light emitting diodes are formed at different positions.

For example, as described above, since the second organic light emitting diodes OLED2 respectively formed in the unit pixels 120 which are adjacent to each other in the first direction are adjacent to each other, and the third organic light emitting diodes OLED3 respectively formed in the unit pixels 120 which are adjacent to each other in the first direction are adjacent to each other, the second and third organic light emitting diodes are formed at different positions in each of unit pixels which are adjacent to each other in the first direction.

However, as described above, in the organic light emitting display panel according to an embodiment of the present invention, when organic light emitting diodes of the same color respectively formed in the unit pixels 120 which are adjacent to each other in the first direction are disposed so as not to be adjacent to each other, positions of the second and third organic light emitting diodes are the same in each of the unit pixels 120 which are adjacent to each other in the first direction.

Seventh, in each of unit pixels which are adjacent to each other in the second direction parallel to the horizontal line, the second and third organic light emitting diodes are formed at different positions.

For example, in the first unit pixel A1 (which is formed at the left upper end) of the four unit pixels 120 illustrated in FIG. 3, the second and third organic light emitting diodes OLED2 and OLED3 are disposed in the vertical direction along the first direction, and particularly, the third organic light emitting diode OLED3 is disposed at the lower side. Also, in the third unit pixel A3 (which is formed at the right upper end) of the four unit pixels 120 illustrated in FIG. 3, the second and third organic light emitting diodes OLED2 and OLED3 are disposed in the vertical direction along the first direction, and particularly, the third organic light emitting diode OLED3 is disposed at an upper side.

Therefore, the second and third organic light emitting diodes OLED2 and OLED3 respectively formed in the first and third unit pixels A1 and A3 which are adjacent to each other in the second direction are formed at different positions.

However, the second and third organic light emitting diodes OLED2 and OLED3 respectively formed in the first and third unit pixels A1 and A3 which are adjacent to each other in the second direction may be formed at the same position. For example, the third unit pixel A3 which is formed at the right upper end among the four unit pixels 120 illustrated in FIG. 3 may be formed in the same type as that of the first unit pixel A1 (which is formed at the left upper end) of the four unit pixels 120 illustrated in FIG. 3.

Eighth, the anode electrode of each of the organic light emitting diodes OLED1 to OLED3 is electrically connected to the driving TFT 112 through an anode electrode 111 formed in the planarizing layer hole H2.

For example, as illustrated in FIG. 3, a first anode electrode 111a formed at the first planarizing layer hole 131 is connected to an anode electrode of the first organic light emitting diode OLED1, a second anode electrode 111b formed at the second planarizing layer hole 133 is connected to an anode electrode of the second organic light emitting diode OLED2, and a third anode electrode 111c formed at the third planarizing layer hole 132 is connected to an anode electrode of the third organic light emitting diode OLED3. Therefore, the anode electrode of each of the organic light emitting diodes is electrically connected to the source electrode of the driving TFT 112 through the planarizing layer hole H2, the connection electrode 150, and the insulating layer hole H1.

As described above, the first organic light emitting diode OLED1 including a blue organic emission layer is not divided by the planarizing layer holes H2 which is formed in the second direction parallel to the horizontal line. Therefore, an area of the first organic light emitting diode B is enlarged, and thus, an aperture ratio of the first organic light emitting diode B is enhanced.

Moreover, since the insulating layer hole H1 should be formed in consideration of positions of a data line, a gate line, and a driving power line, a position of the insulating layer hole H1 is limited. However, the planarizing layer hole H2 may be connected to the driving TFT through the connection electrode 150, and thus, a position of the planarizing layer hole H2 may be freely changed. In particular, in the present specification, the planarizing layer hole H2 is formed at the bank, thereby increasing an aperture ratio of each of the organic light emitting diodes.

Figure 4:
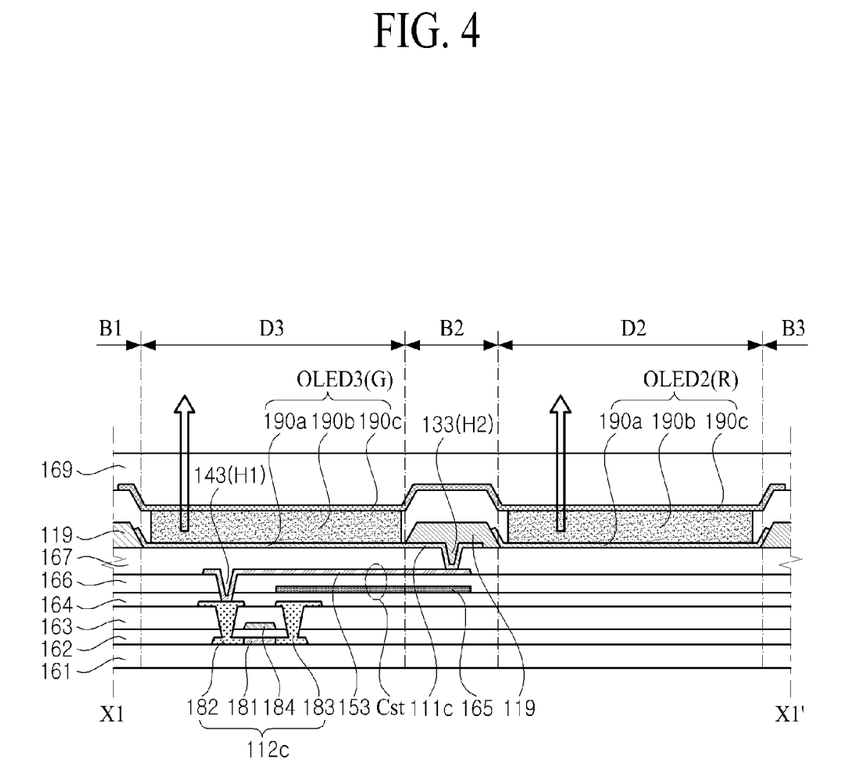
FIG. 4 is an exemplary diagram illustrating a cross-sectional surface taken along line X1-X1' of the organic light emitting display panel of FIG. 3.

FIG. 4 is an exemplary diagram illustrating a cross-sectional surface taken along line X1-X1' of the organic light emitting display panel of FIG. 3.

The organic light emitting display panel 100 according to the embodiments of the present invention, as illustrated in FIG. 4, includes the sub-pixels 110 based on a top emission type. Since FIG. 4 illustrates a cross-sectional surface taken along line X1-X1' of the organic light emitting display panel of FIG. 3, a first bank part B1, a third display part D3, a second bank part B2, a second display part D2, and a third bank part B3 are formed in this order from a left side in the organic light emitting display panel illustrated in FIG. 4.

A bank 119, which divides the third organic light emitting diode OLED3 configuring the first unit pixel A1 and the third organic light emitting diode OLED3 configuring the second unit pixel A2, is formed in the first bank part B1.

The third organic light emitting diode OLED3 is formed in the third display part D3. Therefore, green light is output from the third display part D3. Also, a third driving TFT 112c for driving the third organic light emitting diode OLED3 is formed in the third display part D3.

A bank 119, which divides the second and third organic light emitting diodes OLED2 and OLED3 configuring the first unit pixel A1, is formed in the second bank part B2.

The second organic light emitting diode OLED2 is formed in the second display part D2. Therefore, red light is output from the second display part D2. In this case, as illustrated in FIG. 3, the second insulating layer hole 143 (which is connected to the second driving TFT for driving the second organic light emitting diode OLED2) and the second planarizing layer hole 133 connected to the second insulating layer hole 143 through the second connection electrode 152 do not overlap the second organic light emitting diode OLED2, and thus, the second driving TFT, the second insulating layer hole 143, and the second planarizing layer hole 133 are not illustrated in the second display part D2 of FIG. 4.

A bank 119, which divides the third organic light emitting diode OLED3 configuring the first unit pixel A1 and an organic light emitting diode (not shown) which is formed in another unit pixel formed on the first unit pixel A1, is formed in the third bank part B3.

In this case, the third driving TFT 112c for driving the third organic light emitting diode OLED3 and the third insulating layer hole (H1) 153 connected to the third driving TFT 112c may be formed to overlap a third organic emission layer 190b of the third organic light emitting diode OLED3. Also, the third planarizing layer hole 132 connected to the third connection electrode 153 connected to the third driving TFT 112c is covered by the bank 119 formed in the second bank part B2.

Hereinafter, a structure of a part with the third organic light emitting diode OLED3 formed therein the cross-sectional surface of FIG. 4 will be described in detail.

For example, in the organic light emitting display panel 100 according to an embodiment of the present invention illustrated in FIG. 4, the part with the third organic light emitting diode OLED3 formed therein includes: the third driving TFT 112c formed on a substrate 161; a first insulating layer 164 formed on the third driving TFT 112c; a metal layer 165 which is formed on the first insulating layer 164, and is connected to a gate electrode 184 of the third driving TFT 112c; a second insulating layer 166 which is formed on the first insulating layer 164 to cover the metal layer 165; the third connection electrode 153 which is connected to a source electrode 182 of the third driving TFT 112c through the third insulating layer hole (H1) 143 formed at the first and second insulating layers 164 and 166; a planarizing layer 167 which is formed on the second insulating layer 166 to cover the third connection electrode 153; the third organic light emitting diode OLED3 which includes an anode electrode connected to the third connection electrode 153 through the third planarizing layer hole (H2) 133 formed at the planarizing layer 167; a bank 119 which surrounds an outer portion of the third organic light emitting diode OLED3, and covers the third planarizing layer hole (H2) 133; and an upper substrate 169 which covers an upper end of the bank 119 and an upper end of the third organic light emitting diode OLED3. The substrate 161 is a transparent insulating substrate formed of glass, quartz, ceramic, or plastic. However, the present embodiment is not limited thereto.

The third driving TFT 112c includes: an active layer 181; a gate insulating layer 162 which covers the active layer 181; a gate electrode 184 which is formed on the first gate insulating layer 162; an inter-layer dielectric 163 which covers a gate electrode 184; a source electrode 182 which is formed on the inter-layer dielectric 163, and connected to the active layer 181; and a drain electrode 183 which is formed on the inter-layer dielectric 163 and connected to the active layer 181, which are formed on the substrate 161. The active layer 181 is formed in a pattern type on the substrate 161. The active layer 181 may be formed of an oxide semiconductor such as indium gallium zinc oxide (IGZO), but is not limited thereto.

The gate insulating layer 162 is formed all over the substrate 161 on which the active layer 181 is formed. The gate insulating layer 162 may be formed of an inorganic-based insulating material such as silicon oxide or silicon nitride, but is not limited thereto. As another example, the gate insulating layer 162 may be formed of an organic-based insulating material such as photo acryl or benzocyclobutene (BCB).

The gate electrode 184 is formed in a pattern type on the gate insulating layer 162 so as to overlap the active layer 181. The gate electrode 184, as illustrated in FIG. 2, is electrically connected to the switching TFT TR1 and the electrode.

A plurality of contact holes for exposing a source electrode and a drain electrode, which are respectively formed at one end and the other end of the active layer 181, are formed at the inter-layer dielectric 163.

The source electrode 182 and the drain electrode 183 extend onto the inter-layer dielectric 163. The source electrode 182 and the drain electrode 183 are connected to the active layer 181 on the same plane as that of the active layer 181 through a contact hole which is formed in the inter-layer dielectric 163. The drain electrode 183, as illustrated in FIG. 2, is electrically connected to a first power line through which a first voltage VDD is supplied. The source electrode 182 and the drain electrode 183 may be formed of molybdenum (Mo), aluminum (Al), chromium (Cr), gold (Au), titanium (Ti), nickel (Ni), neodymium (Nd), copper (Cu), or an alloy thereof, and may be formed of a single layer or a multi-layer including two or more layers, which is formed of the metal or the alloy.

The first insulating layer 164 covers the source electrode 182 and the drain electrode 183 which are exposed onto the inter-layer dielectric 163. The third insulating layer hole (H1) 143 is formed at the first insulating layer 164.

The second insulating layer 166 is formed on the first insulating layer 164, and the third insulating layer hole (H1) 143 extends to the second insulating layer 166.

The planarizing layer 167 is formed on the second insulating layer 166, and the third planarizing layer hole (H2) 133 is formed at the planarizing layer 167. A step height may occur in forming the third planarizing layer hole (H2) 133. Therefore, the third planarizing layer hole (H2) 133 is formed in an area which does not overlap the organic emission layer 190b of the third organic light emitting diode OLED3, for increasing an aperture ratio of the organic light emitting display panel. That is, the third planarizing layer hole (H2) 133 is formed in an area which overlaps the bank 119. The third connection electrode 153 is formed between the second insulating layer 166 and the planarizing layer 167. The third connection electrode 153 is connected to the source electrode 182 of the third driving TFT 112c through the third insulating layer hole (H1) 143, and connected to the anode electrode 190a of the organic light emitting diode OLED through the third planarizing layer hole (H2) 133. The third connection electrode 153 electrically connects the source electrode 182 of the third driving TFT 112c to the anode electrode 190a of the third organic light emitting diode OLED3 through the third insulating layer hole (H1) 143 (which is formed not to overlap lines, for example, the gate line and the data line) and the third planarizing layer hole (H2) 133 which is formed not to overlap the organic emission layer 190b of the third organic light emitting diode OLED3. The cathode electrode 190a is formed on the organic emission layer 190b. Since the third driving TFT 112c should be formed at a position adjacent to the gate line and the data line, a position of the third driving TFT 112c is difficult to freely change. Therefore, a position of the third insulating layer hole (H1) 143 directly connected to the source electrode 182 of the third driving TFT 112c is difficult to freely change. However, since the third planarizing layer hole (H2) 133 which connects the third connection electrode 153 to the third organic light emitting diode OLED3 is formed on a layer which differs from that of the data line and the gate line, a position of the planarizing layer hole H1 may be freely changed. In particular, in the present specification, the third planarizing layer hole (H2) 133 is formed at a position which overlaps the bank 119. Therefore, an aperture ratio of the third organic light emitting diode OLED3 is not reduced, and the third organic light emitting diode OLED3 is efficiently disposed. The third connection electrode 153 is formed of a metal material in order for the third driving TFT 112c to be electrically connected to the third organic light emitting diode OLED3. For example, the third connection electrode 153 may be formed of molybdenum (Mo), aluminum (Al), chromium (Cr), gold (Au), titanium (Ti), nickel (Ni), neodymium (Nd), copper (Cu), or an alloy thereof.

The metal layer 165 is formed on the first insulating layer 164, and is covered by the second insulating layer 166. The metal layer 165 is formed in an area which overlaps the third connection electrode 153. The metal layer 165, the third connection electrode 153, and the second insulating layer 166 configure the storage capacitor Cst of FIG. 2. Although not shown in FIG. 4, the metal layer 165 is electrically connected to the gate electrode 184. Also, in FIG. 4, the metal layer 165 is formed on the first insulating layer 164, but the metal layer 165 may be formed on the inter-layer dielectric 163 to overlap the third connection electrode 150, or may be formed on the other insulating layer to overlap the third connection electrode 150.

The third organic light emitting diode OLED3 includes the anode electrode 190a, the organic emission layer 190b, and a cathode electrode 190c. The anode electrode 190a is formed on the planarizing layer 167, and is electrically connected to the third connection electrode 153 through the third planarizing layer hole (H2) 133.

The bank 119 is formed on the anode electrode 190a configuring the third organic light emitting diode OLED3 and the planarizing layer 167, and divides the third organic light emitting diode OLED3 and the second organic light emitting diode OLED2.

Figure 5:
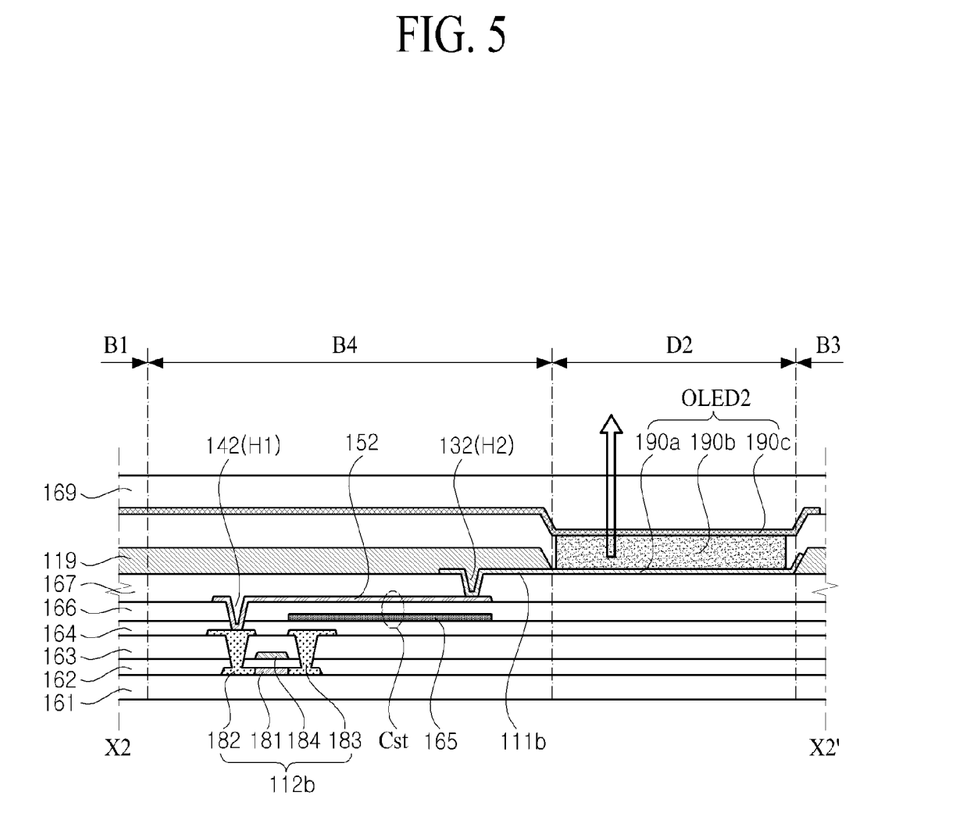
FIG. 5 is an exemplary diagram illustrating a cross-sectional surface taken along line X2-X2' of the organic light emitting display panel of FIG. 3.

FIG. 5 is an exemplary diagram illustrating a cross-sectional surface taken along line X2-X2' of the organic light emitting display panel of FIG. 3.

The organic light emitting display panel 100 according to the embodiments of the present invention, as illustrated in FIG. 5, includes the sub-pixels 110 based on the top emission type. Since FIG. 5 illustrates a cross-sectional surface taken along line X2-X2' of the organic light emitting display panel of FIG. 3, a first bank part B1, a fourth bank part B4, a second display part D2, and a third bank part B3 are formed in this order from a left side in the organic light emitting display panel illustrated in FIG. 5.

A bank 119, which divides the third organic light emitting diode OLED3 configuring the first unit pixel A1 and the third organic light emitting diode OLED3 configuring the second unit pixel A2, is formed in the first bank part B1.

The bank 119 formed in the first bank part B1 extends to the fourth bank part B4. In particular, the bank 119 formed in the fourth bank part B4 divides the third organic light emitting diode OLED3 configuring the first unit pixel A1 and the first organic light emitting diode OLED1 configuring the first unit pixel A1. In this case, as illustrated in FIG. 5, the second driving TFT 112b for driving the second organic light emitting diode OLED2 and the second insulating layer hole (H1) 142 connected to the second driving TFT 112b may be formed in the fourth bank part B4, or may be formed at a position which overlaps the first organic light emitting diode OLED1 or the third organic light emitting diode OLED3. Also, the second planarizing layer hole (H2) 132 connected to the second connection electrode 152 connected to the second driving TFT 112b is covered by the bank 119.

The second organic light emitting diode OLED2 is formed in the second display part D2. Therefore, red light is output from the second display part D2. In this case, as illustrated in FIG. 3, the second insulating layer hole 143 (which is connected to the second driving TFT for driving the second organic light emitting diode OLED2) and the second planarizing layer hole 133 connected to the second insulating layer hole 143 through the second connection electrode 152 do not overlap the second organic light emitting diode OLED2, and thus, the second driving TFT, the second insulating layer hole 143, and the second planarizing layer hole 133 are not illustrated in the second display part D2 of FIG. 5.

A bank 119, which divides the third organic light emitting diode OLED3 configuring the first unit pixel A1 and an organic light emitting diode (not shown in FIG. 6) which is formed in another unit pixel formed on the first unit pixel A1, is formed in the third bank part B3.

Hereinafter, a structure of the cross-sectional surface of FIG. 5 will be described in detail. In this case, details which are the same as or similar to the configuration described above with reference to FIG. 4 are not described, or will be briefly described.

For example, the organic light emitting display panel 100 according to an embodiment of the present invention illustrated in FIG. 5 includes: the second driving TFT 112b which is formed on the substrate 161 so as to overlap the fourth bank B4; a first insulating layer 164 formed on the second driving TFT 112b; a metal layer 165 which is formed on the first insulating layer 164, and is connected to a gate electrode 184 of the second driving TFT 112b; a second insulating layer 166 which is formed on the first insulating layer 164 to cover the metal layer 165; the second connection electrode 152 which is connected to a source electrode 182 of the second driving TFT 112b through the second insulating layer hole (H1) 142 formed at the first and second insulating layers 164 and 166; a planarizing layer 167 which is formed on the second insulating layer 166 to cover the second connection electrode 152; the second organic light emitting diode OLED2 which includes an anode electrode connected to the second connection electrode 152 through the second planarizing layer hole (H2) 132 formed at the planarizing layer 167; a bank 119 which surrounds an outer portion of the second organic light emitting diode OLED2, and covers the second planarizing layer hole (H2) 132; and an upper substrate 169 which covers an upper end of the bank 119 and an upper end of the second organic light emitting diode OLED2.

To provide an additional description, except that the second driving TFT 112b is formed in the fourth bank B4, the cross-sectional surface of the organic light emitting display device of FIG. 5 is formed in the same type as that of the cross-sectional surface of the organic light emitting display device of FIG. 4.

Figure 6:
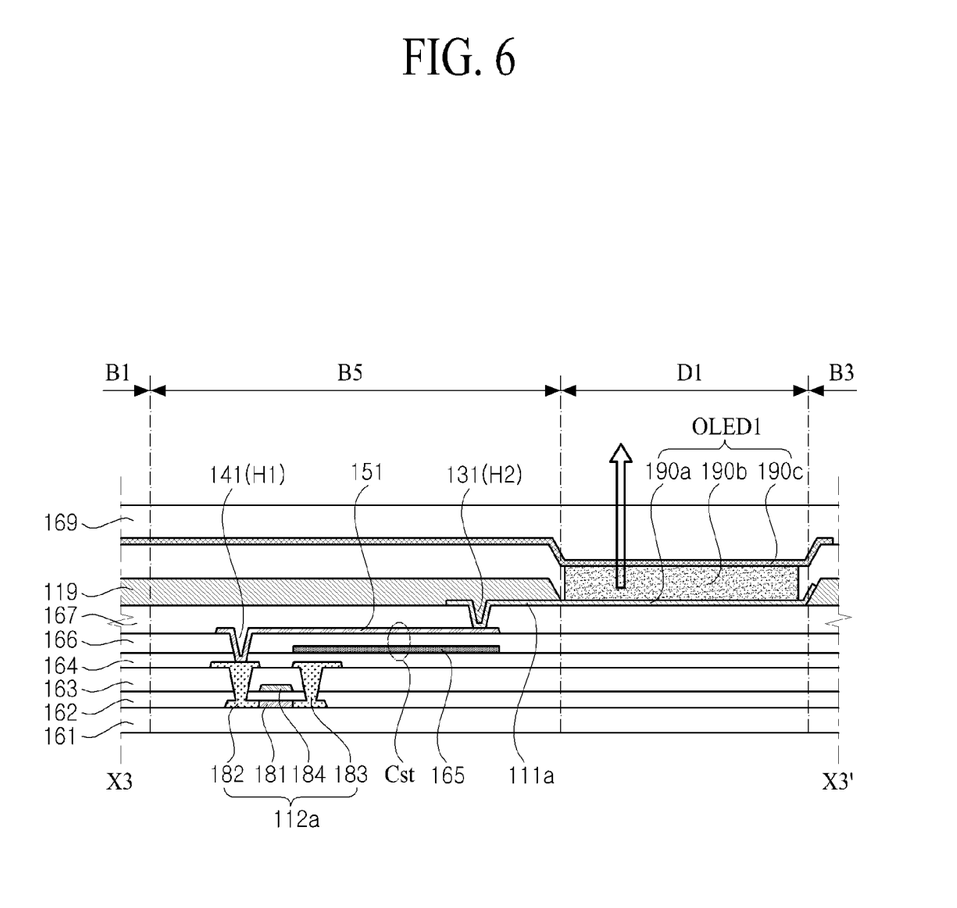
FIG. 6 is an exemplary diagram illustrating a cross-sectional surface taken along line X3-X3' of the organic light emitting display panel of FIG. 3.

FIG. 6 is an exemplary diagram illustrating a cross-sectional surface taken along line X3-X3' of the organic light emitting display panel of FIG. 3.

The organic light emitting display panel 100 according to the embodiments of the present invention, as illustrated in FIG. 6, includes the sub-pixels 110 based on the top emission type. Since FIG. 6 illustrates a cross-sectional surface taken along line X3-X3' of the organic light emitting display panel of FIG. 3, a first bank part B1, a fifth bank part B5, a first display part D1, and a third bank part B3 are formed in this order from a left side in the organic light emitting display panel illustrated in FIG. 6.

A bank 119, which divides the first organic light emitting diode OLED1 configuring the first unit pixel A1 and the first organic light emitting diode OLED1 configuring the second unit pixel A2, is formed in the first bank part B1.

The bank 119 formed in the fifth bank part B5 extends to the fifth bank part B5. In particular, the bank 119 formed in the fifth bank B5 divides the first unit pixel A1 and the third unit pixel A3. In this case, as illustrated in FIG. 6, the first driving TFT 112a for driving the first organic light emitting diode OLED1 and the first insulating layer hole (H1) 141 connected to the first driving TFT 112a may be formed in the fifth bank part B5, or may be formed at a position which overlaps the first organic light emitting diode OLED1. Also, the first planarizing layer hole (H2) 131 connected to the first connection electrode 151 connected to the first driving TFT 112a is covered by the bank 119.

The first organic light emitting diode OLED1 is formed in the first display part D1. Therefore, blue light is output from the first display part D1. In this case, as illustrated in FIG. 3, the first insulating layer hole 141 (which is connected to the first driving TFT for driving the first organic light emitting diode OLED1) and the first planarizing layer hole 131 connected to the first insulating layer hole 141 through the first connection electrode 151 do not overlap the first organic light emitting diode OLED1, and thus, the first driving TFT, the first insulating layer hole 141, and the first planarizing layer hole 132 are not illustrated in the first display part D1 of FIG. 6.

A bank 119, which divides the first organic light emitting diode OLED1 configuring the first unit pixel A1 and an organic light emitting diode (not shown in FIG. 6) which is formed in another unit pixel formed on the first unit pixel A1, is formed in the third bank part B3.

Hereinafter, a structure of the cross-sectional surface of FIG. 6 will be described in detail. In this case, details which are the same as or similar to the configurations described above with reference to FIGS. 4 and 5 are not described, or will be briefly described.

For example, the organic light emitting display panel 100 according to an embodiment of the present invention illustrated in FIG. 6 includes: the second driving TFT 112b which is formed on the substrate 161 so as to overlap the fifth bank B5; a first insulating layer 164 formed on the first driving TFT 112a; a metal layer 165 which is formed on the first insulating layer 164, and is connected to a gate electrode 184 of the first driving TFT 112a; a second insulating layer 166 which is formed on the first insulating layer 164 to cover the metal layer 165; the first connection electrode 151 which is connected to a source electrode 182 of the first driving TFT 112a through the first insulating layer hole (H1) 141 formed at the first and second insulating layers 164 and 166; a planarizing layer 167 which is formed on the second insulating layer 166 to cover the second connection electrode 152; the first organic light emitting diode OLED1 which includes an anode electrode connected to the first connection electrode 151 through the first planarizing layer hole (H2) 131 formed at the planarizing layer 167; a bank 119 which surrounds an outer portion of the first organic light emitting diode OLED1, and covers the first planarizing layer hole (H2) 131; and an upper substrate 169 which covers an upper end of the bank 119 and an upper end of the first organic light emitting diode OLED1.

To provide an additional description, except that the first driving TFT 112a is formed in the fifth bank B5, the cross-sectional surface of the organic light emitting display device of FIG. 6 is formed in the same type as those of the cross-sectional surfaces of the organic light emitting display devices of FIGS. 4 and 5.

A summary on the above-described embodiments of the present invention will be briefly described.

Generally, as an aperture ratio becomes higher, an image quality and service life of an organic light emitting display panel are enhanced. However, since a dead zone is formed by using a fine metal mask, there is a limitation in increasing an aperture ratio of the organic light emitting display device. Also, a via hole, namely, a connection part between an electrode of a driving TFT and an anode electrode of an organic light emitting diode, is needed in designing the driving TFT, and since a step height occurs, a design should be made so that the connection part is added into a non-emission area. Therefore, in the related art, a position of a via hole is inevitably limited.

However, according to the embodiments of the present invention, a position of the planarizing layer hole H2 is freely changed by using the connection electrode 150, an aperture ratio of the organic light emitting display panel increases. For example, in the embodiments of the present invention, the insulating layer hole H1 is formed in consideration of the data line, the gate line, and various power supply lines. In this case, since the insulating layer hole H1 is formed under the planarizing layer 167, a position of the insulating layer hole H1 is less limited. Also, the planarizing layer hole H2 is formed on the planarizing layer 167, but since the planarizing layer hole H2 is connected to the connection electrode 150 connected to the driving TFT through the insulating layer hole H1, the planarizing layer hole H2 may be formed at various positions in each unit pixel. In particular, since the planarizing layer hole H2 is formed under the bank 119, an aperture of the organic light emitting diode is not reduced.

Moreover, in the above description, one insulating layer hole H1, one connection electrode 150, and one planarizing layer hole H2 are used, but three or more holes and two or more connection electrodes may be used, in order to drive one organic light emitting diode.

According to the embodiments of the present invention, since an area of a blue organic emission layer is formed greater than those of other organic emission layers (i.e., red and green organic emission layers) in a unit pixel of the organic light emitting display device, a low emission efficiency of blue can be complemented. Also, a blue organic light emitting diode is formed in a stripe type in a unit pixel, and thus includes an organic emission layer having the greatest area in the unit pixel. Also, in the embodiments of the present invention, a plurality of planarizing layer holes connected to one electrode of an organic light emitting diode are arranged in parallel in a unit pixel, thereby overcoming a limitation in forming the organic light emitting diode through the fine metal mask process. Also, in the embodiments of the present invention, the plurality of planarizing layer holes are arranged in parallel in a unit pixel by using a connection electrode, and a metal layer configuring a storage capacitor with the connection electrode is further provided, thereby removing flickers of an image.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display panel, comprising:
    a plurality of unit pixels, each of the unit pixels including first to third organic light emitting diodes having different colors,
    wherein each of the plurality of unit pixels further includes first to third driving transistors respectively connected to the first to third organic light emitting diodes, a first contact hole connected to one electrode of the first organic light emitting diode, a second contact hole connected to one electrode of the second organic light emitting diode, and a third contact hole connected to one electrode of the third organic light emitting diode, and are arranged in a matrix,
    wherein a plurality of the first organic light emitting diodes are arranged in a stripe type in unit pixels which are adjacent to each other in a first direction,
    a plurality of the third organic light emitting diodes are arranged adjacent to each other at a boundary of respectively adjacent two unit pixels, wherein the two adjacent unit pixels form a unit pixel pair,
    a plurality of second sub-pixels, wherein the second organic light emitting diode is adjacent to the third organic light emitting diode in the unit pixel, and is arranged farther apart from the boundary of the two adjacent unit pixels of the unit pixel pair than the third organic light emitting diodes of the unit pixel pair,
    the second and third contact holes are disposed between the second and third organic light emitting diodes of a respective unit pixel, and
    the first to third contact holes are arranged in parallel in a second direction of a respective unit pixel, wherein the second direction is perpendicular to the first direction.

2. The organic light emitting display panel of claim 1,
    wherein the first contact hole is a first planarizing layer hole;
    wherein the second contact hole is a second planarizing layer hole; and
    wherein the third contact hole is a third planarizing layer hole.

3. The organic light emitting display panel of any one of claim 1, further comprising:
    a first insulating layer hole configured to expose a first electrode of the first driving transistor;
    a second insulating layer hole configured to expose a first electrode of the second driving transistor;
    a third insulating layer hole configured to expose a first electrode of the third driving transistor; and
    a first connection electrode configured to connect the first insulating layer hole to the first contact hole.

4. The organic light emitting display panel of claim 3, further comprising:

a second connection electrode configured to connect the second insulating layer hole to the second contact hole; and a third connection electrode configured to connect the third insulating layer hole to the third contact hole.

5. The organic light emitting display panel of claim 4, further comprising a metal layer disposed with an insulating layer between the metal layer and each of the first to third connection electrodes, and configured to configure a storage capacitor in each of a plurality of sub-pixels.

6. The organic light emitting display panel of claim 1, wherein the first organic light emitting diode comprises an organic emission layer outputting blue light.

7. The organic light emitting display panel of claim 3, further comprising a bank configured to define organic emission layers of the first to third organic light emitting diodes, wherein the bank is formed on the first to third contact holes.

8. The organic light emitting display panel of claim 7, wherein the first to third contact holes are formed in an area which does not overlap the organic emission layers.

9. The organic light emitting display panel of claim 7, wherein the first to third contact holes are filled by the bank.

10. The organic light emitting display panel of claim 5, wherein the metal layer is connected to a gate electrode of a corresponding driving transistor, in each of the plurality of sub-pixels.

\* \* \* \* \*